(12) United States Patent
Ashikaga

(10) Patent No.: US 7,123,499 B2
(45) Date of Patent: Oct. 17, 2006

(54) SEMICONDUCTOR MEMORY DEVICES AND METHODS OF FABRICATING SEMICONDUCTOR MEMORY DEVICE

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/241,955

(22) Filed: Oct. 4, 2005

(65) Prior Publication Data

US 2006/0028856 A1    Feb. 9, 2006

Related U.S. Application Data

(62) Division of application No. 10/761,222, filed on Jan. 22, 2004, now Pat. No. 6,972,980.

(30) Foreign Application Priority Data

Nov. 7, 2003   (JP) .............................. 2003/379192

(51) Int. Cl.
*G11C 5/06* (2006.01)
(52) U.S. Cl. .................... 365/63; 365/145; 438/257
(58) Field of Classification Search .............. 365/63, 365/145, 149; 438/257; 257/295
See application file for complete search history.

(56) References Cited

U.S. PATENT DOCUMENTS

| | | | |
|---|---|---|---|
| 5,671,174 A | | 9/1997 | Koike et al. |
| 6,055,175 A | * | 4/2000 | Kang et al. ................. 365/145 |
| 6,107,656 A | | 8/2000 | Igarashi |
| 6,459,110 B1 | * | 10/2002 | Tani .......................... 257/295 |
| 6,720,596 B1 | | 4/2004 | Ohtsuka et al. |
| 6,856,535 B1 | | 2/2005 | Madan |

FOREIGN PATENT DOCUMENTS

JP    2000269444    9/2000

* cited by examiner

*Primary Examiner*—Gene N. Auduong
(74) *Attorney, Agent, or Firm*—VolentineFrancos&Whitt, PLLC

(57) ABSTRACT

A semiconductor memory device includes a plate line driving portion having a control transistor connected to a plate line, a selection transistor in which a control electrode is connected to a word line and one end of a main current path is connected to a bit line, a ferroelectric capacitor connected to the other end of the main path of the selection transistor and the plate line, a first power supply connected to a sense amplifier and a precharge circuit, and a second power supply connected to a plate line driving portion, disposed as a separate system from the first power supply and insulated at the time of non-operation from the first power supply. The selection transistor is formed in a first semiconductor region and a main current path of the control transistor is formed in a second semiconductor region that is insulated through insulating films from the first region.

4 Claims, 13 Drawing Sheets

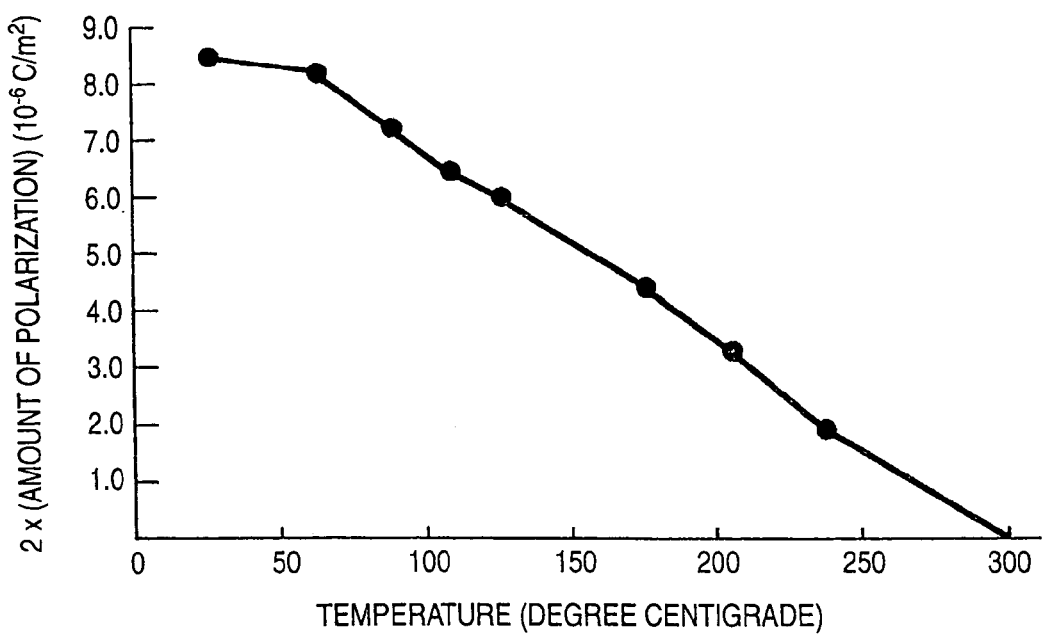

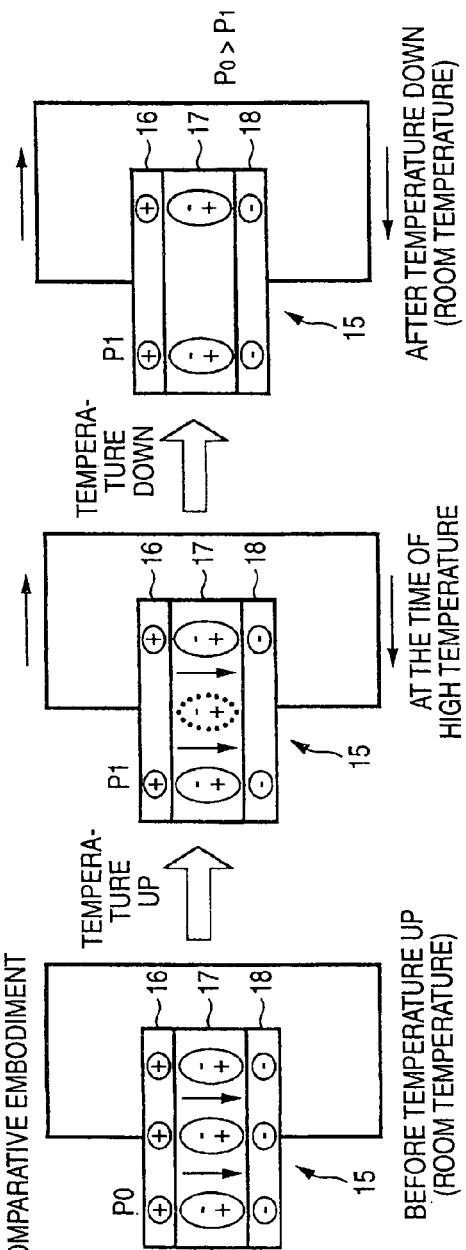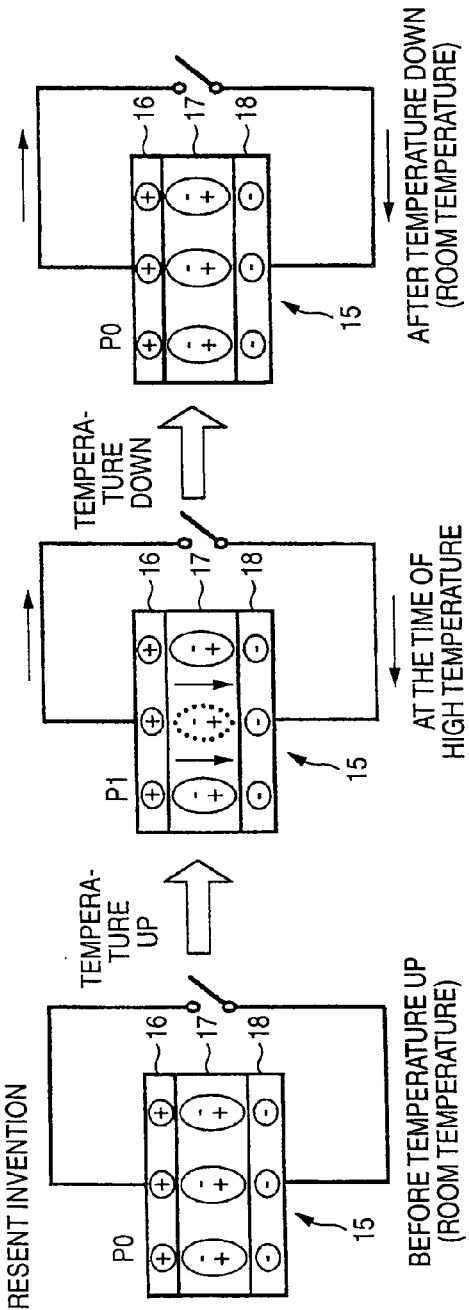

COMPARATIVE EMBODIMENT

PRESENT INVENTION

SEMICONDUCTOR MEMORY DEVICES AND METHODS OF FABRICATING SEMICONDUCTOR MEMORY DEVICE

CROSS REFERENCE TO RELATED APPLICATION

This is a divisional application of application Ser. No. 10/761,222, filed Jan. 22, 2004 now U.S. Pat. No. 6,972,980, which is hereby incorporated by reference in its entirety for all purposes.

BACKGROUND OF THE INVENTION

1. Field of the Invention

The present invention relates to semiconductor memory devices and methods of fabricating the semiconductor memory devices, in particular, semiconductor memory devices with a ferroelectric capacitor and methods of fabricating the same.

2. Description of the Related Art

A semiconductor memory device with a ferroelectric capacitor has the nature that even after a voltage is removed, it retains polarization in a direction of an applied voltage (the nature of spontaneous polarization) and, by making use of the nature of the spontaneous polarization, it is used as a nonvolatile memory that retains data. However, the spontaneous polarization of ferroelectrics has the temperature dependency and tends to decrease as a temperature becomes higher. Accordingly, when the data retention due to the ferroelectric capacitor is performed under a high temperature environment, an amount of spontaneous polarization of the ferroelectric capacitor decreases and the data is likely to be destroyed.

An existing semiconductor memory device that uses a ferroelectric capacitor is described in, for instance, patent literature 1. In the semiconductor memory device, a first transistor that has a ferroelectric capacitor in a gate portion and second and third transistors respectively connected to source and drain regions of the first transistor are formed through an insulating film on a supporting substrate. In such a configuration, in the case of a voltage to the ferroelectric capacitor being ceased to apply, when the second and third transistors are in a non-conduction state, since an active region of the first transistor is insulated with the insulating film from the supporting substrate, the active region of the first transistor becomes a floating state. Thereby, both ends of a series circuit of the ferroelectric capacitor and a gate insulating film, that is, a potential of an electrode of the ferroelectric capacitor and a potential at an interface between the gate insulating film and the active region are inhibited from becoming the same potential, and thereby the inverse bias retention where electric charges are cancelled out between the ferroelectric capacitor and the gate insulating film is inhibited from occurring.

Patent literature 1: JP-A No. 2000-269444 (pages 4 and 5, and FIG. 1).

The semiconductor memory device described in the patent literature 1 is a semiconductor memory device in which an electrode of a ferroelectric capacitor is connected to a gate portion of a first transistor, and owing to the spontaneous polarization of the ferroelectric capacitor the conduction or non-conduction of the first transistor is controlled. In such a configuration, the reverse bias retention between the ferroelectric capacitor and the gate insulating film is suppressed from occurring.

On the other hand, in a semiconductor memory in which a ferroelectric capacitor is connected to source and drain regions of a selection transistor and thereby a voltage is read out of the ferroelectric capacitor, from a reason different from the reverse bias retention, the data of the ferroelectric capacitor are likely to be destroyed. That is, since the ferroelectric capacitor is connected to the source and drain regions of the selection transistor, in the case of the data retention being carried out under a high temperature environment, charges are likely to move through a supporting substrate. Specifically, the source and drain regions of the selection transistor that are connected to one electrode of the ferroelectric capacitor are formed on the supporting substrate and a plate line driving portion that drives a plate line that is connected to the other electrode of the ferroelectric capacitor is also formed on the supporting substrate; accordingly, a path of charge transfer is likely to be formed through the supporting substrate between both electrodes of the ferroelectric capacitor. Accordingly, when the data retention is performed under a high temperature environment, a polarization amount of the ferroelectric capacitor decreases, charges at the electrodes of the ferroelectric capacitor transfer through the above-mentioned path and decrease. Thereafter, even when the ferroelectric capacitor is returned to under a low temperature environment, since charges at the electrodes of the ferroelectric capacitor are diminished, the spontaneous polarization amount does not turn back and the data is likely to be destroyed. In the patent literature 1, there is no mention of the problem of the data retention of the configuration where the ferroelectric capacitor is connected to source and drain regions of the selection transistor, that is, the problem of the data retention capability under a high temperature environment.

An object of the present invention is, in a semiconductor memory device in which a ferroelectric capacitor is connected to a main current path end of a selection transistor, to improve the data retention capability under a high temperature environment.

SUMMARY OF THE INVENTION

A semiconductor memory device according to the invention includes a word line, a bit line and a plate line, and a sense amplifier and a precharge circuit connected to the bit line. Furthermore, the semiconductor memory device includes a plate line driving portion that has a control transistor having a control electrode and a main current path and is connected to a plate line; a selection transistor that has a control electrode and first and second main current path ends disposed at both ends of the main current path, the control electrode being connected to the word line and the first main current path end being connected to the bit line; and a ferroelectric capacitor that has first and second electrodes, the first electrode being connected to the second main current path end and the second electrode being connected to the plate line. Still furthermore, the semiconductor memory device includes a first power supply that is connected to the sense amplifier and the precharge circuit; and a second power supply that is connected to the plate line driving portion, disposed in a separate system from the first power supply and is insulated from the first power supply at the time of non-operation.

Furthermore, the semiconductor memory device includes a first semiconductor region where a main current path of a selection transistor is formed; and a second semiconductor region where a main current path of a control transistor is formed and that is insulated through an insulating film from the first semiconductor region.

In the semiconductor memory device according to the invention, the main current path of the selection transistor and the main current path of the control transistor of the plate line driving portion are insulated through an insulating film. That is, the main current path of the selection transistor and the main current path of the control transistor of the plate line driving portion are insulated on a side of the supporting substrate. The first electrode of the ferroelectric capacitor is connected to the main current path of the selection transistor, on the other hand, the second electrode of the ferroelectric capacitor is connected through the plate line to the main current path of the control transistor of the plate line driving portion; however, since the main current path of the selection transistor and the main current path of the control transistor of the plate line driving portion are insulated on the supporting substrate, a path of charge transfer is not formed through the supporting substrate between the first and second electrodes of the ferroelectric capacitor.

The first electrode of the ferroelectric capacitor is connected through from the selection transistor, bit line to the sense amplifier or precharge circuit to the first power supply, and the second electrode is connected through the plate line and the plate line driving portion to the second power supply. However, the first and second power supplies are separate systems and insulated from each other at the time of non-operation (data retention time); accordingly, a path of charge transfer is not formed through the first and second power supply sides between the first and second electrodes of the ferroelectric capacitor.

Accordingly, even when at the time of data retention under a high temperature environment a spontaneous polarization amount of the ferroelectric film decreases and the charge retention capability deteriorates, there is no path of charge transfer between the first and second electrodes of the ferroelectric capacitor and amounts of charges of the first and second electrodes can be retained. Accordingly, when an environment temperature becomes low, the spontaneous polarization amount of the ferroelectric film can be recovered owing to charges retained by the first and second electrodes, and thereby the date can be inhibited from destroying. Thus, according to the invention, in a semiconductor memory device in which a ferroelectric capacitor is connected to a main current path end of the selection transistor, the data retention under a high temperature environment can be improved.

BRIEF DESCRIPTION OF THE DRAWINGS

FIG. 4 is a diagram for explaining the temperature dependency of the spontaneous polarization.

FIGS. 7A and 7B are diagrams for explaining the temperature dependency of the data retention capability.

DESCRIPTION OF THE PREFERRED EMBODIMENTS (1) First Embodiment
(Configuration)

Figure 1:
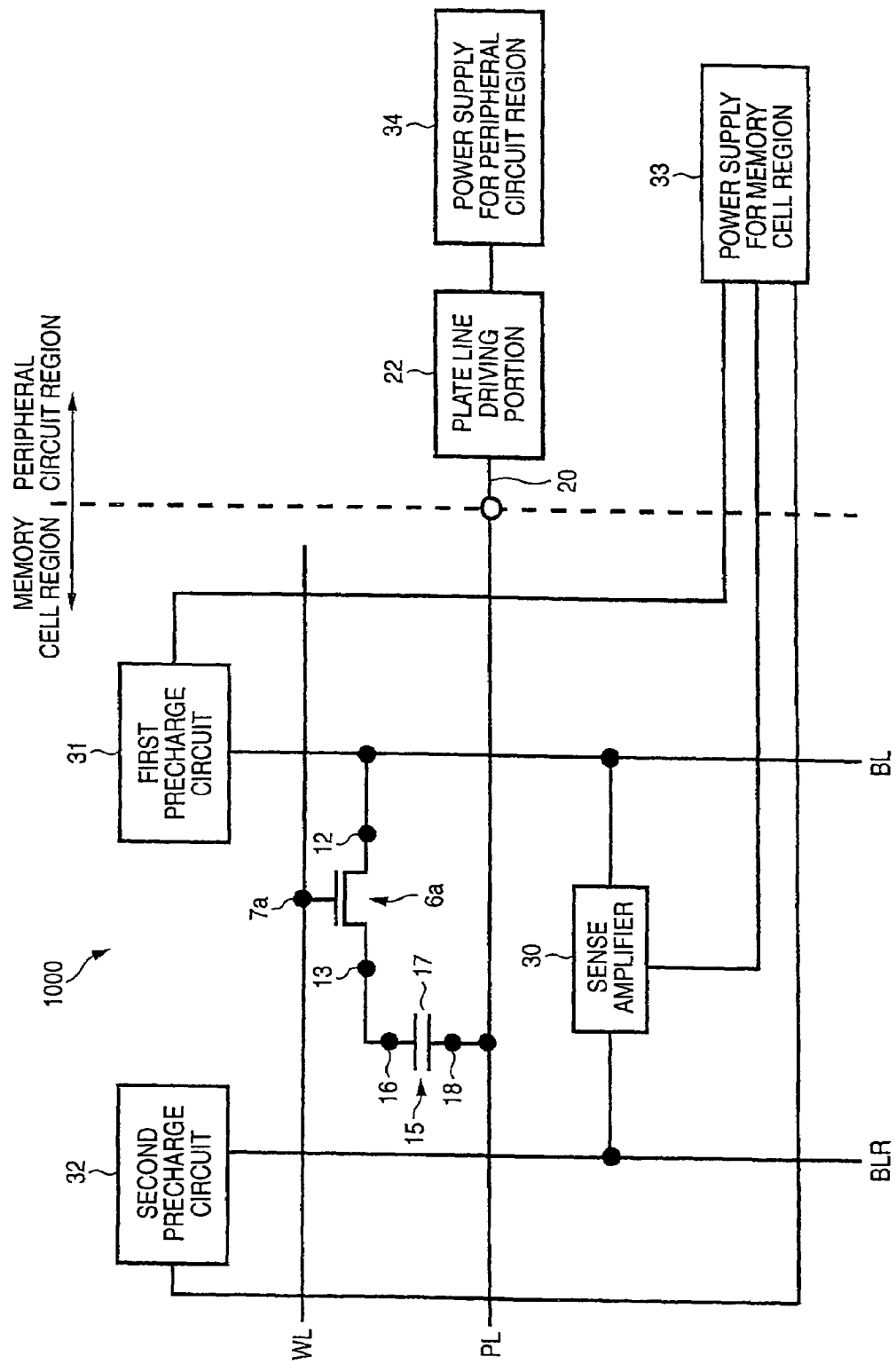
FIG. 1 is an electric circuit diagram of a semiconductor memory device involving a first embodiment.

FIG. 1 is an electric circuit diagram of a semiconductor memory device 1000 involving a first embodiment of the invention. FIG. 3D is a sectional diagram of the semiconductor memory device 1000. The semiconductor memory device 1000 is applied to a non-volatile memory device that makes use of a ferroelectric capacitor. The semiconductor memory device 1000 includes a memory cell region (first semiconductor region) and a peripheral circuit region (second semiconductor region).

In the memory cell region, a word line WL, a bit line BL, a reference bit line BLR, a plate line PL, at least one memory cell, a sense amplifier 30, a first precharge circuit 31 and a second precharge circuit 32 are formed. The memory cell region, as mentioned below, is formed on an SOI substrate (Silicon On Insulator) made of a supporting substrate 1 that is a semiconductor substrate, an insulating film 2 formed on a surface of the supporting substrate 1, and a semiconductor film 4 formed on a surface of the insulating film 2. Although the SOI substrate is used here, as far as a substrate having a structure in which a semiconductor film is formed on an insulating film, other kind of substrate may be used. For instance, an SOS (Silicon On Sapphire) substrate in which a semiconductor film is formed on a sapphire substrate and a substrate for fabricating a TFT in which a semiconductor film is formed on a glass substrate can be used.

The memory cell includes a selection transistor 6a and a ferroelectric capacitor 15. The selection transistor 6a includes a gate electrode 7a as a control electrode, a source electrode 12 that is connected to a source region 8a as a first main current path end and a drain electrode 13 that is connected to a drain region 9a as a second main current path end. The ferroelectric capacitor 15 includes electrodes 16 and 18, and a ferroelectric film 17 disposed between the electrodes 16 and 18. The gate electrode 7a of the selection transistor 6a is connected to the word line WL, the source electrode 12 of the selection transistor 6a is connected to the bit line BL, and the drain electrode 13 of the selection transistor 6a is connected to the electrode 16 of the ferroelectric capacitor 15. Here, the source electrode 12 of the selection transistor 6a may be connected to the electrode 16 of the ferroelectric capacitor 15 and the drain electrode 13 may be connected to the bit line BL. The electrode 18 of the ferroelectric capacitor 15 is connected to the plate line PL.

The first precharge circuit 31 applies a predetermined voltage to the bit line BL to precharge. The second precharge circuit 32 applies a reference voltage to a reference bit line BLR. The sense amplifier 30 is connected to the bit line BL and the reference bit line BLR, compares a voltage read out of the memory cell to the bit line BL and a reference voltage applied to the reference bit line BLR, and thereby judges data retained in the memory cell. The reference bit line BLR and the second precharge circuit 32, instead of being disposed separately from the bit line BL and the first precharge circuit 31, may use one of adjacent bit lines BL as a reference bit line and the first precharge circuit connected to a bit line that is used as a reference bit line as the second precharge circuit that generates a reference voltage. In this case, the first precharge circuit 31 combines a function of precharging the bit line BL and a function of generating a reference voltage.

In the peripheral circuit region, a plate line driving portion 22, a power supply for peripheral circuit 34, and a power supply for memory cell region 33 are formed. The peripheral circuit region, as mentioned below, is formed on an SOI (Silicon On Insulator) substrate made of a supporting substrate 1 that is a semiconductor substrate, an insulating film 2 formed on a surface of the supporting substrate 1 and a semiconductor film 4 formed on a surface of the insulating film 2.

The plate line driving portion 22 is connected through a plate line connection portion 20 to the plate line PL and applies a predetermined voltage to the plate line PL. The power supply for peripheral circuit 34 supplies a voltage to the plate line driving portion 22. The power supply for the memory cell region 33 supplies a voltage to the sense amplifier 30, the first precharge circuit 31 and the second precharge circuit 32. The power supply for the peripheral circuit region 34 drives the plate line driving portion 22. The power supply for the memory cell region 33 and the power supply for the peripheral circuit region 34 are disposed as separate systems and are completely insulated at the time of non-operation. To separately dispose the power supply for the memory cell region 33 and the power supply for the peripheral circuit region 34 means that the power supply for the memory cell region 33 and the power supply for the peripheral circuit region 34 are formed so that a common wiring may not be used and short circuit may not be caused through a wiring even at the of non-operation.

Figure 2:
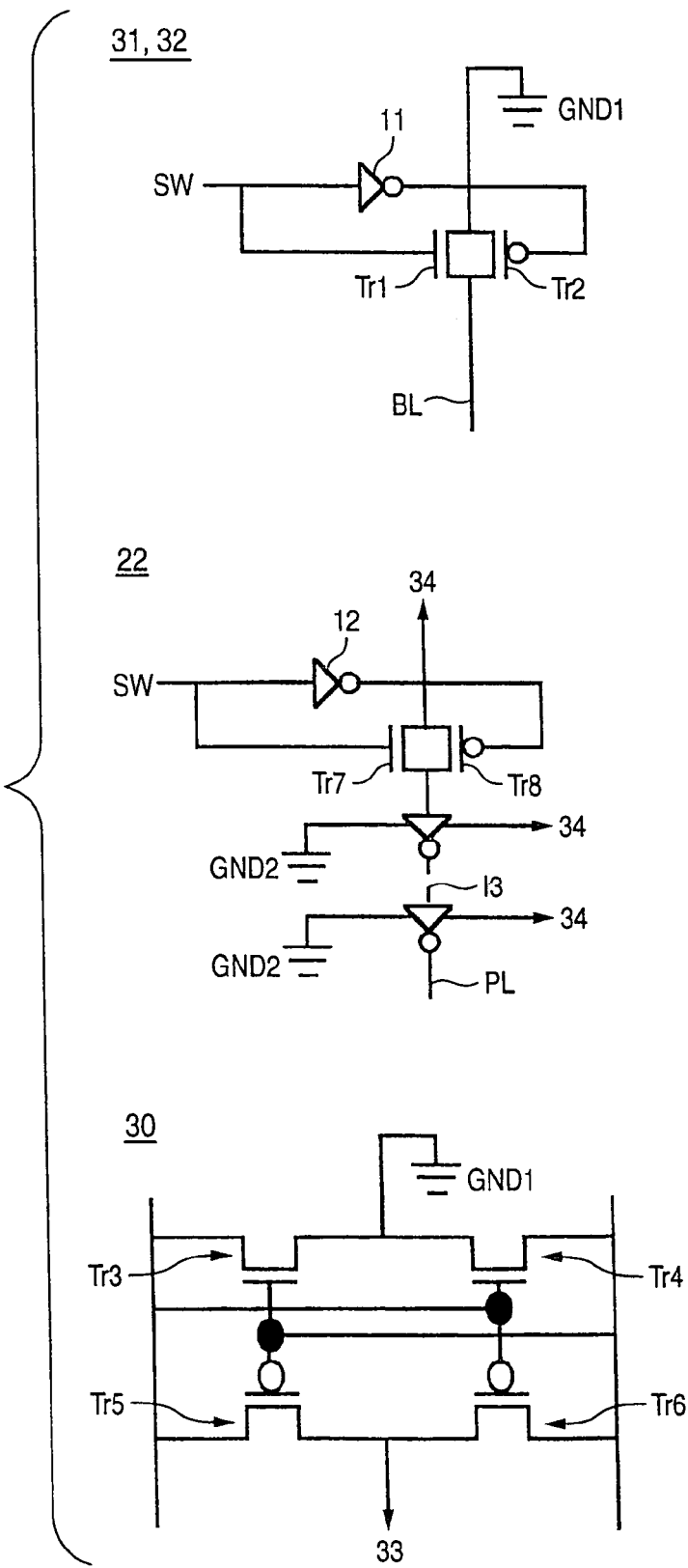
FIG. 2 shows examples of configurations of a sense amplifier, a precharge circuit and a plate line driving portion.

FIG. 2 shows configuration examples of the first and second precharge circuits 31 and 32, the sense amplifier 30 and the plate line driving portion 22.

The first and second precharge circuits 31 and 32 each include an inverter I1 thereto a driving signal SW is input and a transfer gate including transistors Tr1 and Tr2 respectively driven by the driving signal SW and a output signal from the inverter I1. The first and second precharge circuits 31 and 32, in the case of the Tr1 and Tr2 being conducted, connect the bit line BL to a ground line GND1 to input a ground potential to the bit line BL.

The sense amplifier 30 is constituted of transistors Tr3 Tr3 and Tr4 the ground line GND1 is connected, and to a connection of the Tr5 and Tr6 the power supply 33 is connected. Still furthermore, the bit line BL is connected to gate electrodes of the Tr3 and Tr5 and the reference bit line BLR is connected to gate electrodes of the Tr4 and Tr6. In the sense amplifier 30, owing to potentials of the BL and BLR, a combination of the Tr3 and Tr5 is conducted or a combination of the Tr4 and Tr6 is conducted.

The plate line driving portion 22 is constituted of an inverter I2 thereto a driving signal SW is input, a transfer gate including transistors Tr7 and Tr8 respectively driven by the driving signal SW and a output signal from the inverter I2, and a plurality of inverters I3. The inverters I3 each are connected to the power supply 34 and the ground line GND2. The plate line driving portion 22, in the case of the Tr7 and Tr8 being in conduction, connects the plate line PL through the inverter I3 to the power supply 34.

In the present embodiment, the power supply 33 connected to the first and second precharge circuits 31 and 32 and the sense amplifier 30 (memory cell region) and the power supply 34 connected to the plate line driving portion 22 (peripheral circuit portion) each are formed into separate systems and completely insulated at the time of non-operation. Furthermore, the ground line GND1 and the ground line GND2 are insulated from each other. Accordingly, at the time of non-operation, the bit line BL and the plate line PL can be inhibited from short-circuiting through the power supply 33 and the power supply 34 or through the ground line GND1 and the ground line GND2.

If the power supply 33 and the power supply 34 were to be formed into the same system or were not to be completely insulated at the time of non-operation, or the ground line GND1 and the ground line GND2 were to be in common, although the main current paths of the transistors that constitute the first and second precharge circuits 31 and 32, the sense amplifier 30 and the plate line driving portion 22 would have large resistance in the non-conduction state, as time go on, charges would transfer through the main current paths of the transistors, and the bit line BL and the plate line PL might be short-circuited. In such a case, between the electrode 16 of the ferroelectric capacitor 15 connected through the main current path of the selection transistor 6a to the bit line BL and the electrode 18 connected to the plate line PL, a path of charge transfer would be formed through the power supplies 33 and 34 or the ground lines GND1 and GND2, and charges of the ferroelectric capacitor 15 might decrease at the time of high temperature data retention. The charge transfer through the power supplies 33 and 34 or the ground lines GND1 and GND2 is, as mentioned above, the charge transfer through the main current path of the transistor in a non-conduction state; accordingly, the time constant at which the charges of the ferroelectric capacitor 15 decrease is large; however, it might cause a problem in the case of the data being stored for a long time in a high temperature state.

By contrast, in the present embodiment, as mentioned above, the power supply 33 and the power supply 34 are individually formed into separate systems and completely insulated at the time of non-operation, and the ground line GND1 and the ground line GND2 are insulated from each other; accordingly, the charges of the ferroelectric capacitor 15 can be inhibited from transferring through the power supplies 33 and 34 or the ground lines GND1 and GND2. Thereby, the data can be retained for a long time in a state of high temperature.

In the semiconductor memory device 1000, the word line WL actuates so that the source electrode 12 and the drain electrode 13 of the selection transistor 6a are brought into conduction, a voltage is supplied through the bit line BL and the selection transistor 6a to the electrode 16 of the ferroelectric capacitor 15, and at the same time a voltage is supplied through the plate line PL to the electrode 18 of the ferroelectric capacitor 15, thereby the spontaneous polarization of the ferroelectric capacitor 15 is caused and the data is written in, thereafter the voltage is ceased to apply to between the electrodes 16 and 18 of the ferroelectric capacitor 15, and thereby the data is retained.

(Cross Section Structure)

With reference to FIG. 3D, a cross section structure of the semiconductor memory device 1000 will be explained.

The semiconductor memory device 1000 is provided with a supporting substrate 1 that is a semiconductor substrate, an insulating film 2 and an SOI substrate that has a semiconductor film 4 formed through the insulating film 2 on the supporting substrate 1, a memory cell region and a peripheral circuit region being formed on the SOI substrate.

On the semiconductor film 4, the selection transistor 6a and the control transistor 6b that are isolated by an element isolation region 3 made of an insulating film are formed. The selection transistor 6a is disposed in the memory cell region and has a source region 8a and a drain region 9a that are formed in an active region 4a, and a gate electrode 7a that is formed through a gate insulating film on the active region 4a in between the source region 8a and the drain region 9a. Furthermore, the gate electrode 7a is connected to the word line WL. Here, the source region 8a and the drain region 9a may be the opposite each other.

The transistor 6b is disposed in the peripheral circuit region and has a source region 8b and a drain region 9b that are formed in an active region 4b, and a gate electrode 7b that is formed through a gate insulating film on the active region 4b in between the source region 8b and the drain region 9b. Here, the source region 8b and the drain region 9b may be the opposite each other. The transistor 6b is a control transistor (for instance, a transistor that constitutes the inverter I3 in FIG. 2) of the plate line driving portion 22. Here, other transistors of the plate line driving portion 22 and other circuits of the peripheral circuit region are omitted. Furthermore, on the semiconductor film 4, a transistor 6c that is connected to the bit line BL is formed. The transistor 6c typically represents one that is connected to the bit line BL of transistors that constitute the first precharge circuit 31, the second precharge circuit 32 or the sense amplifier 30.

Furthermore, an interlayer insulating film 5 is formed so as to cover the selection transistor 6a and the transistor 6b, on the interlayer insulating film 5 the ferroelectric capacitor 15 being formed. The ferroelectric capacitor 15 is constituted with the electrode 18, a ferroelectric film 17 and the electrode 16 stacked sequentially. The electrode 18 that is a lower electrode, in order to establish electrical connection from the above, is formed protruded outside of the ferroelectric film 17 and the electrode 16. The ferroelectric film 17 is made of, for instance, SBT ($SrBiTa_2O_9$), PZT ($Pb(Zr_xO_{1-x})$) SBTN ($SrBi_2(Ta, Nb)_2O_9$) or BLT (($Bi, La)_4Ti_3O_{12}$). The electrodes 16 and 18 are made of, for instance, Pt, Ir or the like , and may be formed with an adherence layer or an oxygen inhibiting layer interposed between the electrodes 16 and 18 and buried wirings 14 and 19 described below.

On the interlayer insulating film 5, an interlayer insulating film 25 is formed so as to cover the ferroelectric capacitor 15. In the interlayer insulating film 25, openings that penetrate through the interlayer insulating film 25 and expose respectively the electrodes 16 and 18 of the ferroelectric capacitor 15 are formed. Furthermore, in the interlayer insulating film 25, openings that penetrate through the interlayer insulating films 25 and 5 and expose the source regions and the drain regions of the selection transistors 6a through 6c are formed.

On the interlayer insulating film 25, the bit line BL, the source electrode 12 that is connected to the bit line BL and also connected through a buried wiring 10 to the source region 8a, and the drain electrode 13 that is connected through a buried wiring 11 to the drain region 9a and also connected through a buried wiring 14 to the electrode 16 of the ferroelectric capacitor 15 are formed. Furthermore, on the interlayer insulating film 25, the plate line PL that is connected through a buried wiring 19 to the electrode 18 of the ferroelectric capacitor 15 is formed. Still furthermore, on the interlayer insulating film 25, the plate line connection portion 20 that is connected to the plate line PL and also connected through a buried wiring 21 to the source region 8a of the transistor 6b is formed. Furthermore, on the interlayer insulating film 25, the bit line BL that is connected through a buried wiring 10a to the drain region 9b of the transistor 6c is formed.

(Fabricating Method)

In the following, a method of fabricating a semiconductor memory device 1000 will be explained with reference to FIG. 3.

Figure 3A:
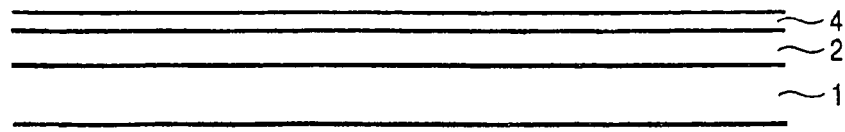
FIGS. 3A through 3D are sectional diagrams for explaining a method of fabricating the semiconductor memory device involving the first embodiment.

As shown in FIG. 3A, an SOI (Silicon On Insulator) substrate in which on a supporting substrate 1 that is a semiconductor substrate made of Si a semiconductor film 4 is formed through an insulating film 2 is prepared.

Figure 3B:
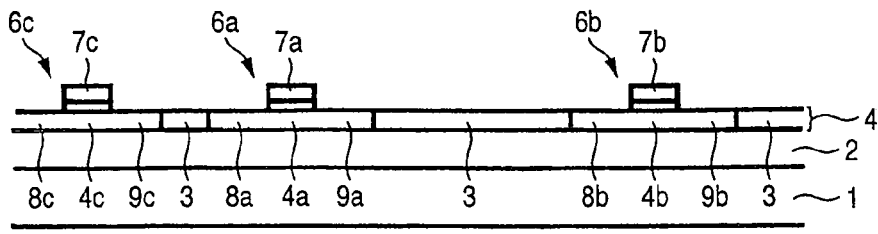

In the next place, as shown in FIG. 3B, an element isolation region 3 is formed in the semiconductor film 4. Furthermore, in order to control a threshold voltage, an N or P type impurity (for instance, phosphorus P as the N type impurity and boron B as the P type impurity) is selectively ion implanted followed by activating, and thereby active regions 4a through 4c are formed. Subsequently, an insulating film made of $SiO_2$ or the like and poly-silicon are sequentially deposited to mask regions where gate electrodes 7a through 7c and the word line WL are formed by means of photolithography and etching. The insulating film and the poly-silicon are etched by means of, for instance, RIE (Reactive Ion Etching), and thereby a gate insulating film and gate electrodes 7a and 7b and a word line WL are formed. Subsequently, into the active regions 4a through 4c the P or N type impurity (for instance, arsenic As as the N type impurity and boron B as the P type impurity) is implanted to form source regions 8a through 8c and drain regions 9a through 9c in the active regions 4a through 4c, and thereby selection transistors 6a through 6c are formed.

Figure 3C:
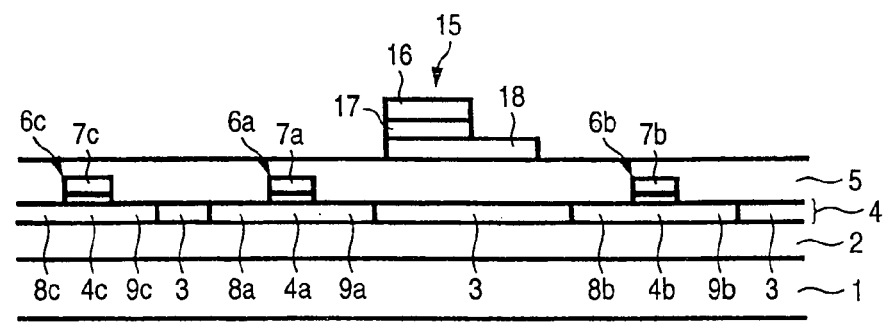
Figure 3D:
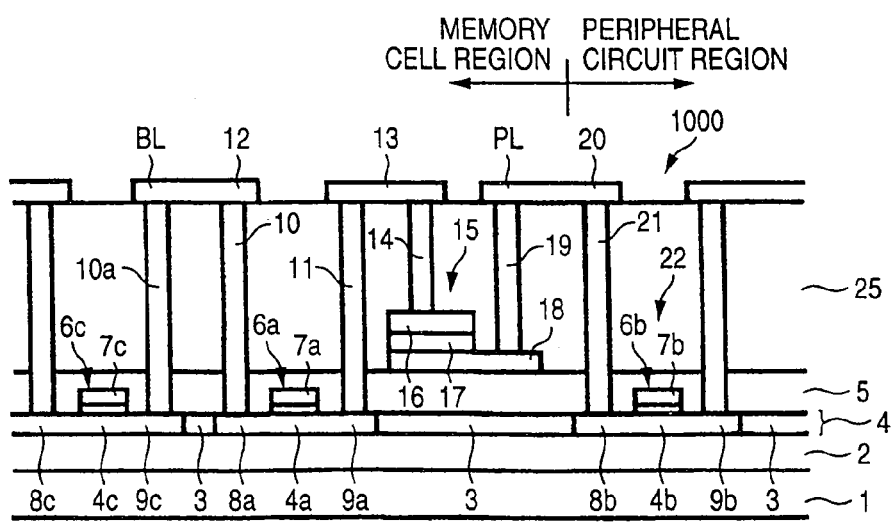

Thereafter, as shown in FIG. 3C, by means of CVD method, an interlayer insulating film 5 made of $SiO_2$ or $Si_3N_4$ is deposited to cover the selection transistors 6a through 6c with the interlayer insulating film 5. In the next place, on the interlayer insulating film 5, a Pt film, an STB film and a Pt film are sequentially deposited followed by patterning by means of photolithography and etching, and thereby a ferroelectric capacitor 15 is formed.

Subsequently, as shown in FIG. 3D, by means of CVD method, an interlayer insulating film 25 made of $SiO_2$ or $Si_3N_4$ is deposited on the interlayer insulating film 5 to cover the ferroelectric capacitor 15 with the interlayer insulating film 25. Thereafter, the interlayer insulating films 5 and 25 are subjected to the photolithography and etching, and thereby openings that expose the source regions 8a through 8c and the drain regions 9a through 9c, and electrodes 16 and 18 are formed. In the next place, on the interlayer insulating film 25, a conductive film is deposited and the openings each are buried with a conductive film. Subsequently the conductive film is patterned by means of the photolithography and etching and thereby a source electrode 12 and a drain electrode 13, a plate line PL, a plate line connection portion 20, a bit line BL and soon are formed.

Here, fabrication of only the transistor 6c of the first precharge circuit 31, the second precharge circuit 32 or the sense amplifier 30 and the control transistor 6b of the plate line driving portion 22 is shown; however, other transistors also can be similarly fabricated.

Here, the SOI substrate is used; however, as far as a substrate has a structure in which a semiconductor film is formed on an insulating film, other kinds of substrates can be used. For instance, an SOS (Silicon On Sapphire) substrate in which a semiconductor film is formed on a sapphire substrate and a substrate for use in fabrication of TFT in which a semiconductor film is formed on a glass substrate may be used.

(Operations)

In the semiconductor memory device 1000, a voltage is supplied from the plate line PL to the electrode 18 of the ferroelectric capacitor 15 and a voltage is supplied from the bit line BL through the selection transistor 6a to the electrode 16, thereby a voltage is applied between the electrodes 16 and 18 of the ferroelectric capacitor 15, and thereby a ferroelectric film 17 is spontaneously polarized. Thereafter, the voltage is ceased to apply to between the electrodes 16 and 18 to allow the ferroelectric film 17 to retain the spontaneous polarization, and thereby data are stored. However, the spontaneous polarization of the ferroelectric film 17 has the temperature dependency; that is, as shown in FIG. 4, as an environmental temperature rises, a polarization amount decreases. Accordingly, since the retention capability of the data is remarkably lowered under a high temperature environment, the data are likely to be destroyed.

Figure 5:
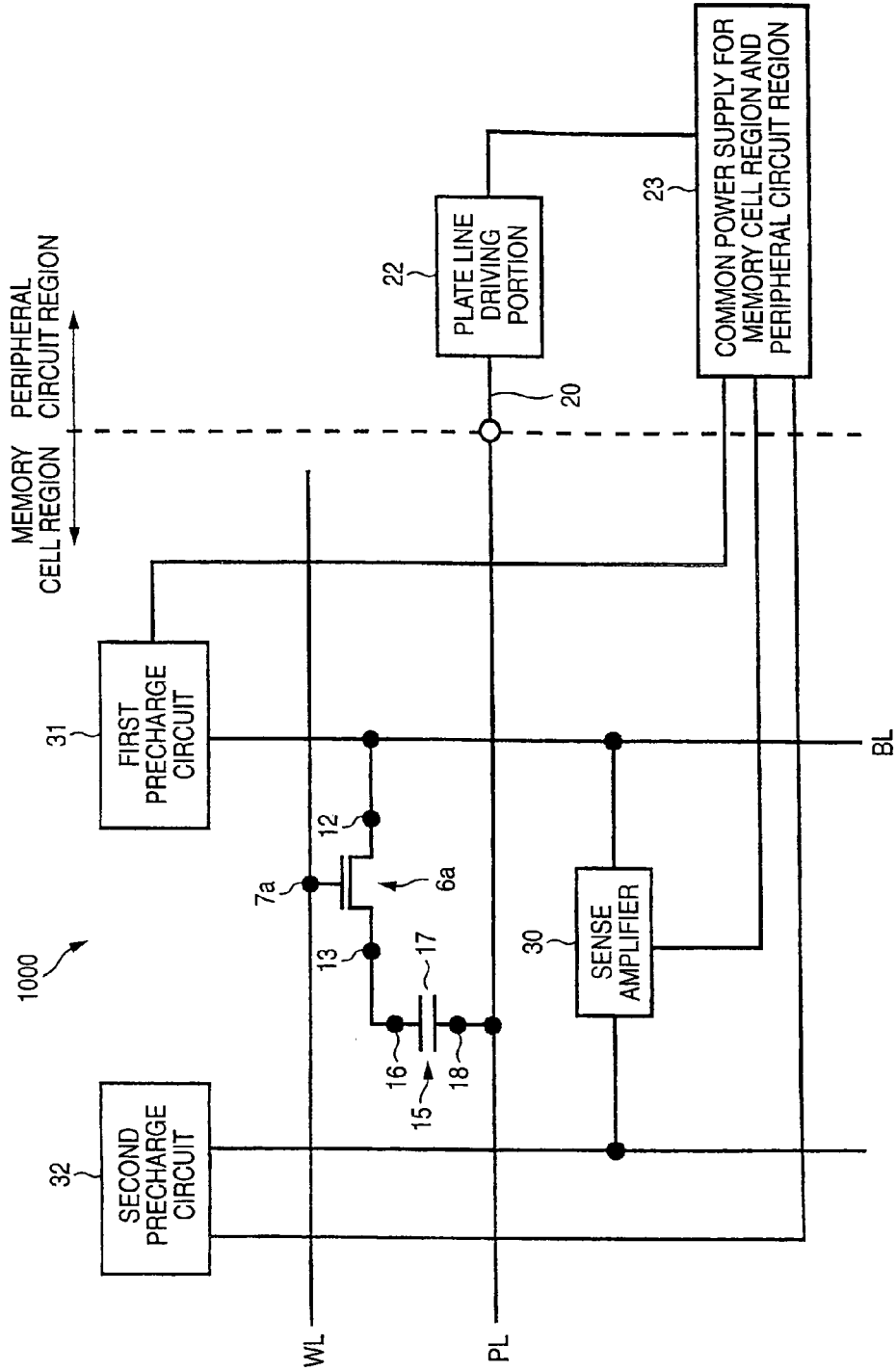
FIG. 5 is an electric circuit diagram of a semiconductor memory device involving a comparative embodiment.
Figure 6:
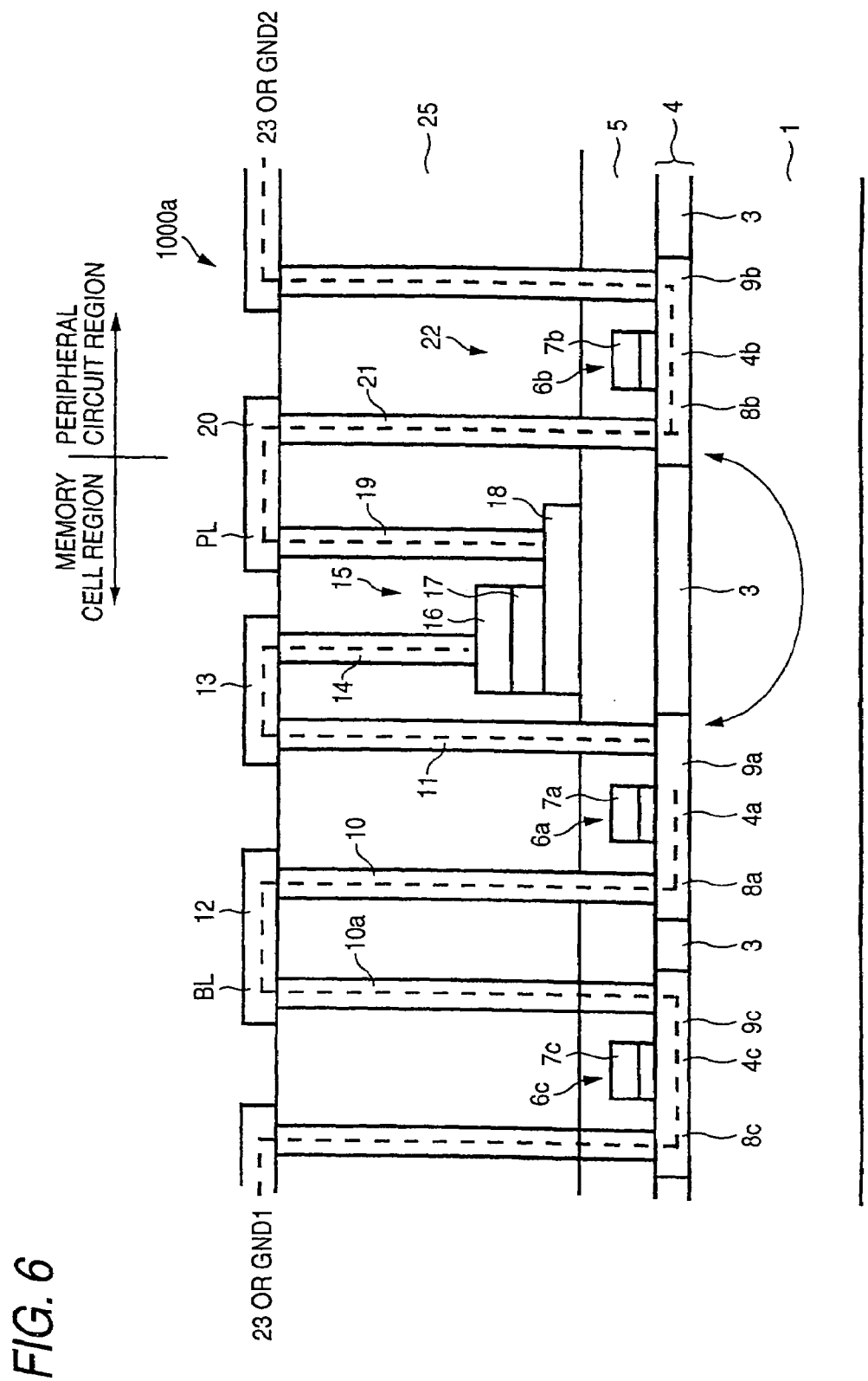
FIG. 6 is a sectional diagram of the semiconductor memory device involving the comparative embodiment.

FIG. 5 is an electric circuit diagram of a semiconductor memory device 1000a as a comparative embodiment for comparison with the semiconductor memory device 1000 involving the present invention, and FIG. 6 is a sectional diagram of the semiconductor memory device 1000a.

In the semiconductor memory device 1000a involving a comparative embodiment, a power supply for a memory cell region and a power supply for a peripheral circuit (corresponding to the power supplies 33 and 34 according to the present embodiment) are disposed as a common power supply 23 in the same system, and the power supply for a memory cell region and the power supply for a peripheral circuit are not insulated at the time of non-operation. Furthermore, a ground line GND1 that is connected to first and second precharge circuits 31 and 32 and a sense amplifier 30 and a ground line GND2 that is connected to a plate line driving portion 22 are also disposed in common. Furthermore, in the semiconductor memory device 1000a involving the comparative embodiment, the memory cell region and the peripheral circuit region are formed together on a supporting substrate 1 as a substrate bulk region. As shown in FIG. 6, in the semiconductor memory device 1000a, a supporting substrate 1 and a semiconductor film 4 are not insulated with an insulating film 2 and a selection transistor 6a and a control transistor 6b are directly formed on the supporting substrate 1. In the semiconductor memory device 1000a, since the supporting substrate 1 is not insulated from active regions 4a and 4b by means of an insulating film 2, charges may transfer through a path from the electrode 16 of the ferroelectric capacitor 15, from the active region 4a to the active region 4b (arrow mark in the drawing), and to the electrode 18.

Figure 8A:
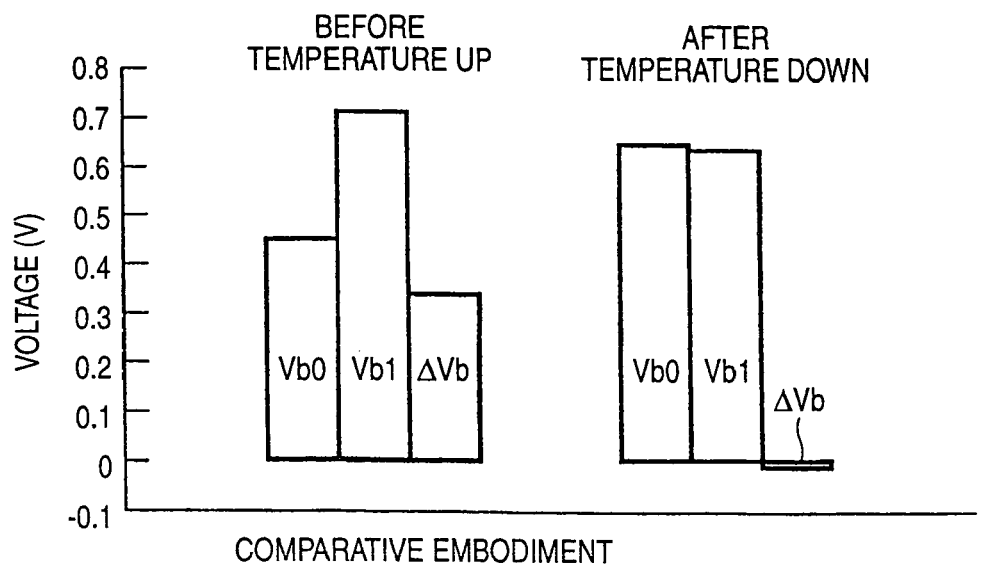
FIGS. 8A and 8B are diagrams for explaining the temperature dependency of a voltage difference between electrodes of a ferroelectric capacitor.
Figure 8B:
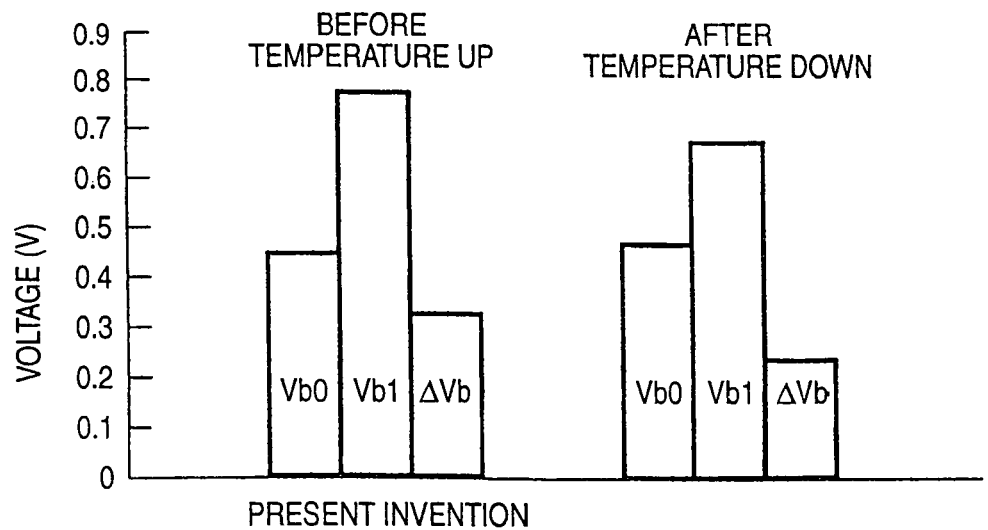

FIGS. 7A and 7B are diagrams in which the semiconductor memory device 1000 according to the present invention and the semiconductor memory device 1000a according to the comparative embodiment are compared of the data retention capability under a high temperature environment. FIGS. 8A and 8B are comparative diagrams in which the semiconductor memory device 1000 and the semiconductor memory device 1000a, potentials Vb1 of the bit line BL, potentials. Vb0 of the reference bit line BLR and bit line potential differences ΔVb (=Vb0−Vb1) are compared.

First, an environmental temperature of the semiconductor memory devices 1000 and 1000a is set at room temperature, after the ferroelectric capacitors 15 are allowed to spontaneously polarize at a voltage of 1.8 V applied between the bit line BL and the plate line PL, data are retained for 15 minutes at an environmental temperature of 240 degree centigrade.

In "before temperature up (room temperature)" in FIGS. 7A and 7B, polarization amounts of the ferroelectric capacitors 15 of the semiconductor memory device 1000 and the semiconductor memory device 1000a under a room temperature environment are both P0, and the bit line voltage differences ΔVb are substantially 0.3 V. Subsequently, when the semiconductor memory device 1000 and the, semiconductor memory device 1000a are heated up to 240 degree centigrade and left for 15 minutes under a high temperature environment, owing to the high temperature characteristics shown in FIG. 4, polarization amounts of the ferroelectric capacitors 15 decrease from P0 to P1.

In the semiconductor memory device 1000a, since the active region 4a of the selection transistor 6a and the active region 4b of the control transistor 6b are formed together on the supporting substrate 1, a path of charge transfer through the electrode 16, the drain electrode 13, the supporting substrate 1 (a path between the active region 4a and the active region 4b shown with arrow marks in FIG. 6), the plate line PL and the electrode 18 is formed. Furthermore, a power supply for a memory cell region that is connected from the sense amplifier 30 or the first precharge circuit 31 through the selection transistor 6a and the bit line BL to the electrode 16 and a power supply for a peripheral circuit region that is connected through the plate line driving portion 22 and the plate line PL to the electrode 18 are disposed as a common power supply 23 in the same system, the power supply for a memory cell region and the power supply for a periphery circuit region are not insulated at the time of non-operation, and the ground lines GND1 and GND2 are not insulated; accordingly, between the electrodes 16 and 18, paths (paths shown with broken lines in FIG. 6) in which charges transfer through the power supplies 33 and 34, or the ground lines GND1 and GND2 are formed. Accordingly, as shown in "at the time of high temperature", in FIG. 7A, during the data retention under a high temperature environment, when a polarization amount of the ferroelectric capacitor 15 decreases and the charge retention capability at the electrodes 16 and 18 deteriorates, charges on the electrodes 16 and 18 transfer by a path through the supporting substrate 1, a path through the power supplies 33 and 34, and a path through the ground lines GND1 and GND2. Accordingly, during the data retention under a high temperature environment, a polarization amount of the ferroelectric capacitor 15 decreases to P1 (<P0).

Thereafter, even when the environment is returned to under the room temperature environment, as shown in "after temperature down (room temperature)" of FIG. 7A, the charges of the electrodes 16 and 18 have transferred; accordingly, as far as charges are not supplied from the outside, a polarization amount of the ferroelectric capacitor 15 does not return to an original polarization amount P0 and remains at P1 (<P0). As a result, as shown in FIG. 8A, the potential difference ΔVb between the electrodes 16 and 18 after the temperature down decreases to substantially zero.

On the other hand, in the semiconductor memory device 1000, the active region 4a of the selection transistor 6a and the active region 4b of the control transistor 6b are insulated with the insulating film 2, the power supplies 33 and 34 are in separate systems and completely insulated at the time of non-operation, and the ground lines GND1 and GND2 are insulated from each other. Accordingly, between the electrodes 16 and 18, any one of paths of charge transfer through the supporting substrate 1, through the power supplies 33 and 34 and through the ground lines GND1 and GND2 is not formed. That is, even when a polarization amount of the ferroelectric capacitor 15 decreases from P0 to P1 (<P0) during the data retention under a high temperature environment, the charges at the electrodes 16 and 18 cannot transfer. Accordingly, in the semiconductor memory device 1000, during the data retention under a high temperature environment, as shown in "at the time of high temperature" of FIG. 7B, even when a polarization amount of the ferroelectric film 17 decreases from P0 to P1, charge amounts at the electrodes 16 and 18 are retained.

As a result, in the semiconductor memory device 1000, as shown in "after temperature down (room temperature)∞ of FIG. 7B, after the environmental temperature is lowered to room temperature, without supplying charges from the outside, owing to the charges retained at the electrodes 16 and 18, a polarization amount increases from P1 to P0. Furthermore, after the environmental temperature is lowered to room temperature, the polarization amount returns to P0; accordingly, as shown in FIG. 8B, the potential difference ΔVb can maintains a value substantially same as that before temperature up and the data can be retained even after undergoing the high temperature environment.

In the semiconductor memory device 1000a, the power supplies 33 and 34 are constituted into the same system and both the memory cell region and the peripheral circuit region are formed on the supporting substrate 1 that is a bulk region; accordingly, between the electrodes 16 and 18 of the ferroelectric capacitor 15, since a path of charge transfer through the supporting substrate 1, a path of charge transfer through the power supplies 33 and 34 and a path of charge transfer through the ground lines GND1 and GND2 are formed, at the time of the data retention under a high temperature environment, the charges transferred between the electrodes 16 and 18.

Other than the configuration of the semiconductor memory device 1000a, when only any one of conditions of the active regions of the memory cell region and the peripheral circuit region being insulated from each other (first condition), the power supplies 33 and 34 being separate systems and completely insulated at the time of non-operation (second condition) and the ground lines GND1 and GND2 being insulated from each other (third condition) is not satisfied, similarly to the case of the semiconductor, memory device 1000a, during the data retention under a high temperature environment, a path through which charges transfer between the electrodes 16 and 18 is formed. When the first condition is not satisfied, a path of charge transfer through the supporting substrate 1 between the electrodes 16 and 18 is formed; accordingly, when the data retention is performed under a high temperature environment followed by returning to room temperature, the potential difference between the electrodes 16 and 18 becomes as shown in FIG. 8A to result in losing the data.

When at least one of the second and third conditions is not satisfied, a path of charge transfer through the power supplies 33 and 34 and a path of charge transfer through the ground lines GND1 and GND2 are generated; however, since both paths are ones that go through the main current path of the transistor in a non-conduction state, a velocity of charge transfer is smaller in comparison with that of a path through the supporting substrate 1. Accordingly, the charges are not likely to be lost in a short time but when the charges are retained for a long time, the data are lost as shown in FIG. 8A.

(2) Second Embodiment
(Configuration)

Figure 10:
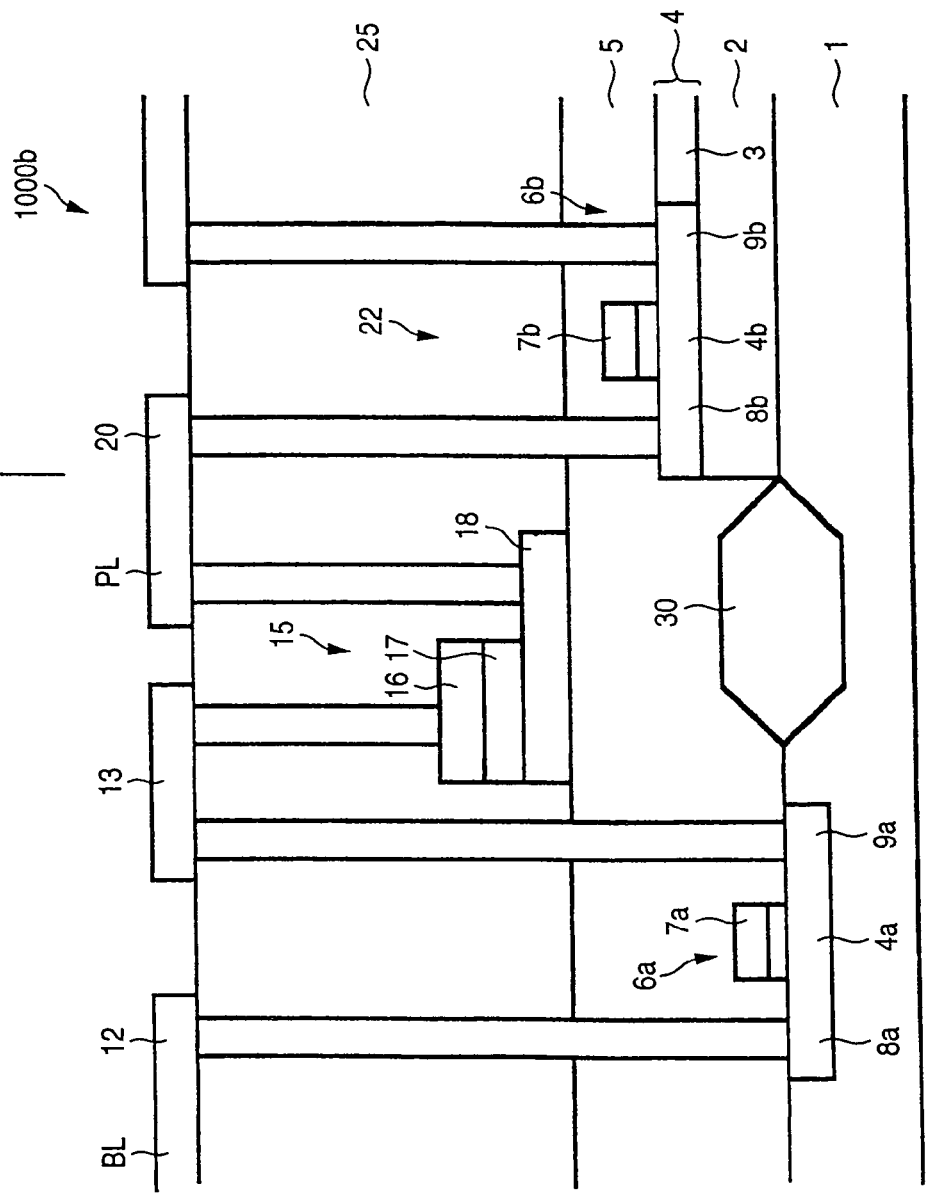
FIG. 10 is a sectional diagram for explaining a method of fabricating the semiconductor memory device involving a second embodiment.

FIG. 10 is a sectional diagram of a semiconductor memory device 1000b involving a second embodiment. An electric circuit diagram of the semiconductor memory device 1000b is the same as FIG. 1.

In the present embodiment, in a memory cell region, an active region 4a of a selection transistor 6a is formed on a supporting substrate 1 that is a substrate bulk region. On the other hand, a control transistor 6b, similarly to the case of the first embodiment, is formed on a semiconductor film 4. Furthermore, similarly to FIG. 1, a power supply for memory cell region 33 and a power supply for peripheral circuit region 34 are formed in separate systems and completely insulated at the time of non-operation. Still furthermore, a ground line GND1 and a ground line GND2 are insulated from each other.

(Method of Fabrication)

In the following, a method of fabricating the semiconductor memory device 1000b will be explained with reference to FIGS. 9A through 9D and FIG. 10.

Figure 9A:
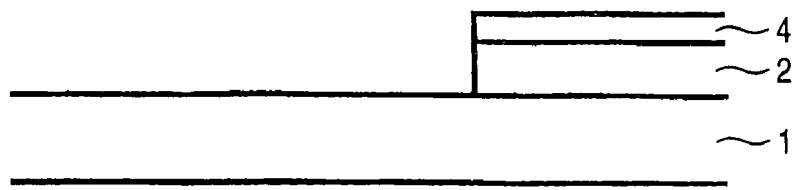
FIGS. 9A through 9D are sectional diagrams for explaining a method of fabricating a semiconductor memory device involving a second embodiment.

An SOI (Silicon On Insulator) substrate in which on a supporting substrate 1 that is a semiconductor substrate made of Si a semiconductor film 4 is formed through an insulating film 2 is prepared. As shown in FIG. 9A, the semiconductor film 4 and the insulating film 2 in the memory cell region are removed by means of photolithography and etching, and thereby the supporting substrate 1 as the substrate bulk region is exposed.

Figure 9B:
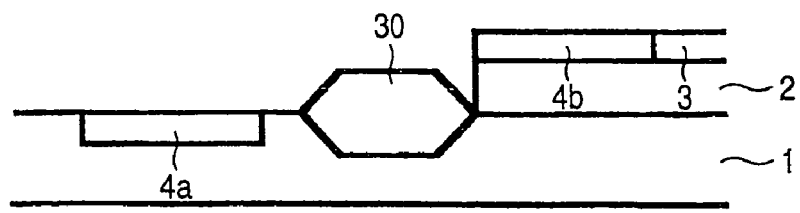

In the next place, as shown in FIG. 9B, an element isolation region 30 is formed on a surface of the supporting substrate 1 and an element isolation region 3 is formed on the insulating film 2. Furthermore, an N or P type impurity (for instance, phosphorus P as the N type impurity and boron B as the P type impurity) is selectively ion implanted followed by activating, and thereby active regions 4a and 4b are formed.

Figure 9C:
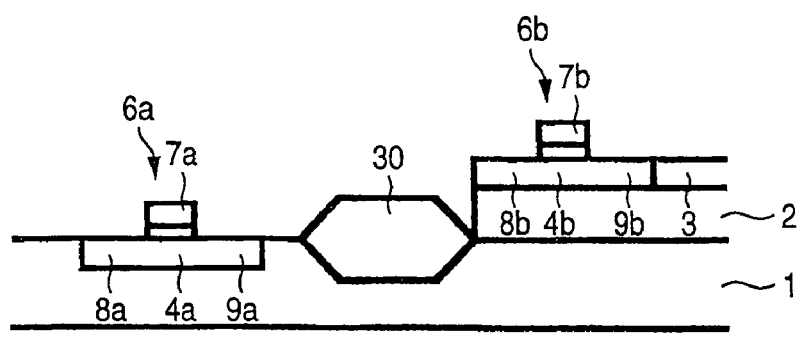

Subsequently, as shown in FIG. 9C, an insulating film made of $SiO_2$ and poly-silicon are sequentially deposited to mask regions where gate electrodes 7a and 7b and a word line WL are formed by means of photolithography and etching. The insulating film and the poly-silicon are etched by means of, for instance, RIE (Reactive Ion Etching) and thereby a gate insulating film and gate electrodes 7a and 7b and a word line WL are formed.

Figure 9D:
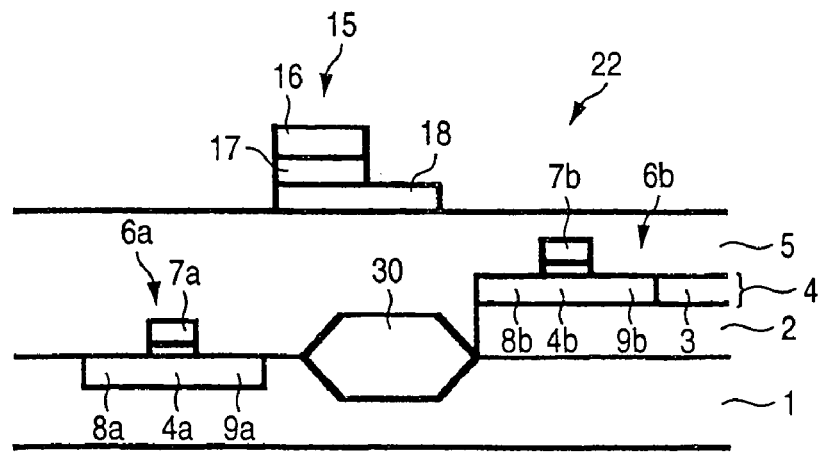

Subsequently, as shown in FIG. 9D, into the active regions 4a and 4b a P or N type impurity (for instance, arsenic As as the N type impurity and boron B as the P type impurity) is implanted to form a source region 8a and a drain region 9a in the active region 4a and a source region 8b and a drain region 9b in the active region 4b. Thereafter, by means of CVD methods an interlayer insulating film 5 made of $SiO_2$ or $Si_3N_4$ is deposited to cover the selection transistor 6a and the control transistor 6b with the interlayer insulating film 5. In the next place, on the interlayer insulating film 5, a Pt film, an STB film and a Pt film are sequentially deposited followed by patterning by means of photolithography and etching, and thereby a ferroelectric capacitor 15 is formed.

Subsequently, as shown in FIG. 10, by means of CVD method, an interlayer insulating film 25 made of $SiO_2$ or $Si_3N_4$ is deposited on the interlayer insulating film 5 to cover the ferroelectric capacitor 15 with the interlayer insulating film 25. Thereafter, the interlayer insulating films 5 and 25 are subjected to the photolithography and etching, and thereby openings that expose the source region 8a and the drain region 9a, electrodes 16 and 18, the source region 8b and the drain region 9b are formed. In the next place, on the interlayer insulating film 25, a conductive film is deposited and the openings each are buried with the conductive film. Subsequently, the conductive film is patterned by means of the photolithography and etching, and thereby a source electrode 12 and a drain electrode 13, a plate line PL, a plate line connection portion 20, a bit line BL and so on are formed.

Here, the SOI substrate is used. However, as far as a substrate has a structure in which a semiconductor film is formed on an insulating film, other kinds of substrates may be used. For instance, an SOS (Silicon On Sapphire) substrate in which a semiconductor film is formed on a sapphire substrate and a substrate for use in TFT fabrication in which a semiconductor film is formed on a glass substrate may be used.

(Operations)

In the present embodiment, although the active region 4a of the selection transistor 6a is formed on the supporting substrate 1, the active region 4b of the control transistor 6b is insulated by the insulating film 2 from the supporting substrate 1; accordingly, similarly to the first embodiment, between the electrodes 16 and 18 of the ferroelectric capacitor 15, a path in which charges transfer through the supporting substrate 1 is not formed. Furthermore, similarly to the first embodiment, the power supplies 33 and 34 are formed into separate systems and completely insulated at the time of non-operation and the ground lines GND1 and GND2 are insulated from each other; accordingly, between the electrodes 16 and 18 of the ferroelectric capacitor 15, neither a path in which charges transfer through the power supplies 33 and 34 nor a path in which charges transfer through the ground lines GND1 and GND2 is formed. Accordingly, at the time of high temperature data retention, that is, at the time of high temperature non-operation, even when the spontaneous polarization of the ferroelectric capacitor 15 decreases, charges of the electrodes 16 and 18 of the ferroelectric capacitor 15 do not transfer and are retained.

Furthermore, since active regions of transistors in the memory cell region such as the selection transistor 6a and so on are formed on the supporting substrate 1, the instability that might be caused owing to the active region being floating at the time of operation of the transistors in the memory cell region can be avoided.

(Third Embodiment)

(Configuration)

Figure 12:
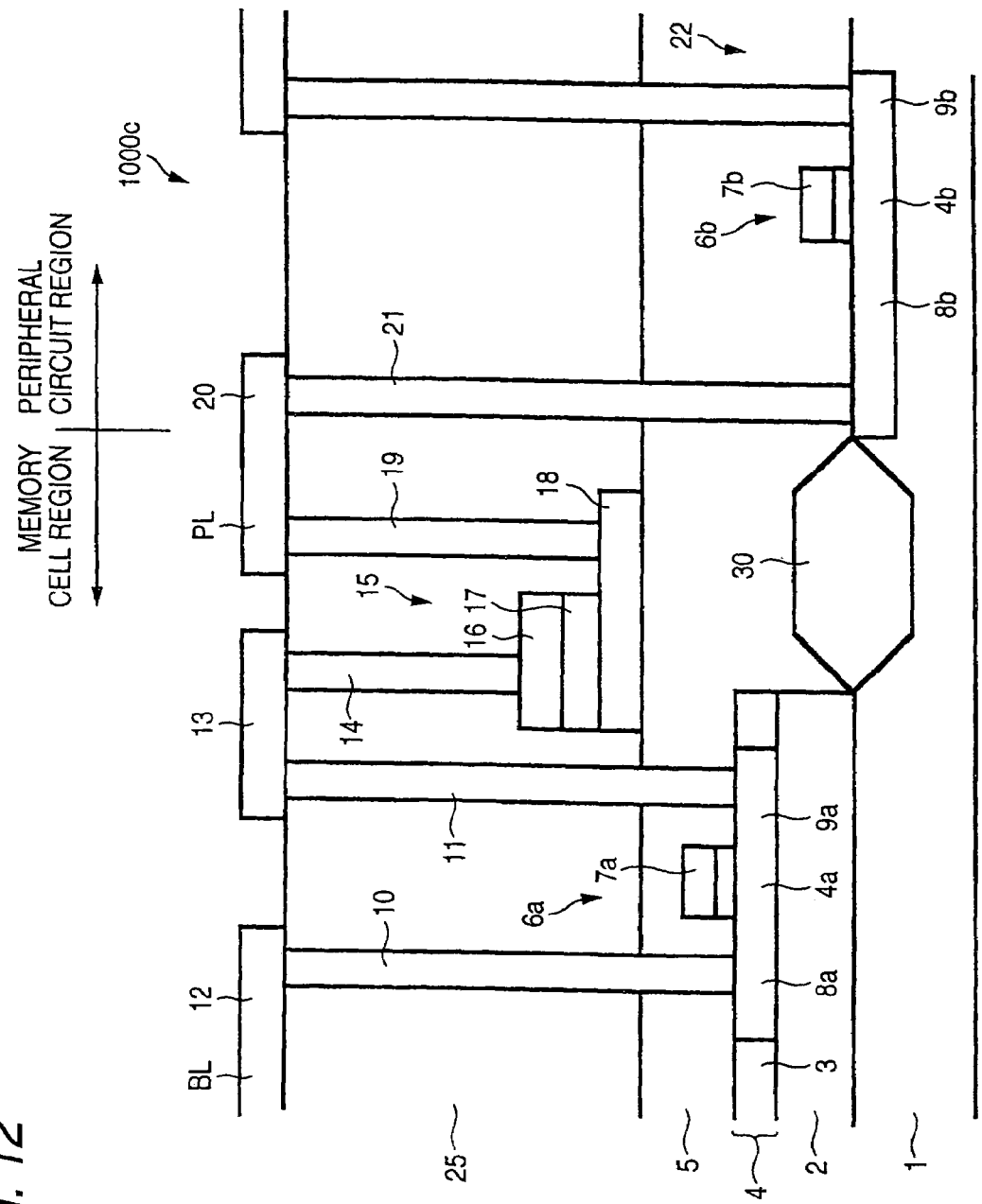
FIG. 12 is a sectional diagram for explaining a method of fabricating a semiconductor memory device involving a third embodiment.

FIG. 12 is a sectional diagram of a semiconductor memory device 1000c involving a third embodiment. An electric circuit diagram of the semiconductor memory device 1000c is the same as FIG. 1.

In the present embodiment, an active region 4a of a selection transistor 6a is, similarly to the first embodiment, formed through an insulating film 2 on a supporting substrate 1. On the other hand, active regions of transistors in the peripheral circuit region such as an active region 4b of a control transistor 6b and so on are formed on the supporting substrate 1 that is a substrate bulk region. Furthermore, similarly to FIG. 1, a power supply for memory cell region 33 and a power supply for peripheral circuit region 34 are formed into separate systems and completely insulated at the time of non-operation. Still furthermore, a ground line GND1 and a ground line GND2 are insulated from each other.

(Method of Fabrication)

In the following, a method of fabricating the semiconductor memory device 1000c will be explained with reference to FIGS. 11A through 11D and FIG. 12.

Figure 11A:
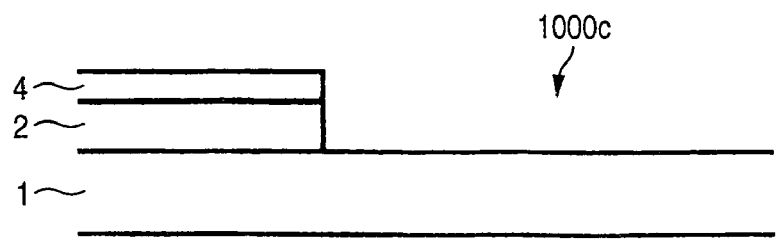
FIGS. 11A through 11D are sectional diagrams for explaining a method of fabricating a semiconductor memory device involving a third embodiment.

An SOI (Silicon On Insulator) substrate in which on a supporting substrate 1 that is a semiconductor substrate made of Si a semiconductor film 4 is formed through an insulating film 2 is prepared. As shown in FIG. 11A, the semiconductor film 4 and the insulating film 2 in the peripheral circuit region are removed by means of photolithography and etching, and thereby the supporting substrate 1 as the substrate bulk region is exposed.

Figure 11B:
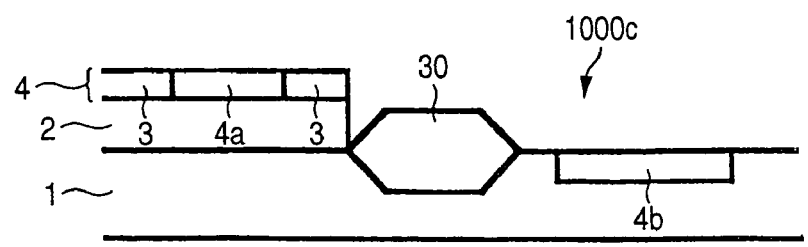

In the next place, as shown in FIG. 11B, an element isolation region 30 is formed on a surface of the supporting substrate 1 and an element isolation region 3 is formed in the semiconductor film on the insulating film 2. Furthermore, an N or P type impurity (for instance, phosphorus P as the N type impurity and boron B as the P type impurity) is selectively ion implanted followed by activating, and thereby active regions 4a and 4b are formed.

Figure 11C:
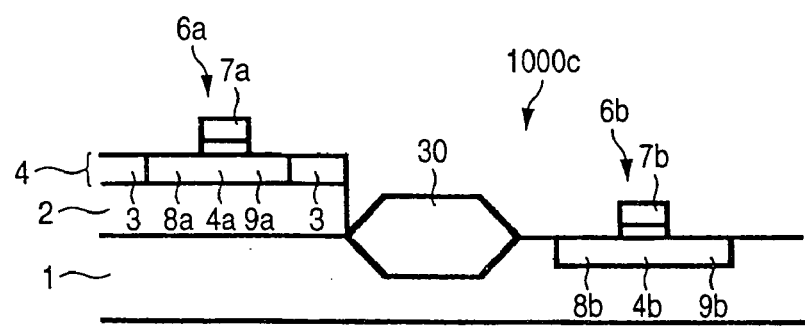

Subsequently, an insulating film made of $SiO_2$ and poly-silicon are sequentially deposited to mask regions where gate electrodes 7a and 7b and a word line WL are formed by means of photolithography. The insulating film and the poly-silicon are etched by means of, for instance, RIE (Reactive Ion Etching) and thereby, as shown in FIG. 11C, a gate insulating film and gate electrodes 7a and 7b and a word line WL (not shown in the drawing) are formed. Furthermore, into the active regions 4a and 4b a P or N type impurity (for instance, arsenic As as the N type impurity and boron B as the P type impurity) is implanted to form a source region 8a and a drain region 9a in the active region 4a and a source region 8b and a drain region 9b in the active region 4b.

Figure 11D:
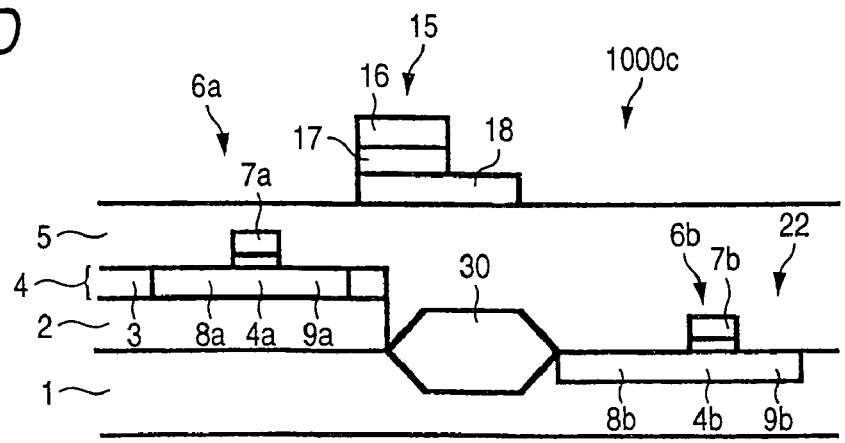

Thereafter, as shown in FIG. 11D, by means of CVD method, an interlayer insulating film 5 made of $SiO_2$ or $Si_3N_4$ is deposited to cover the selection transistors 6a and the control transistor 6b with the interlayer insulating film 5. In the next place, on the interlayer insulating film 5, a Pt film, an STB film and a Pt film are sequentially deposited followed by patterning these by means of photolithography and etching, and thereby a ferroelectric capacitor 15 is formed.

Subsequently, as shown in FIG. 12, by means of CVD method, an interlayer insulating film 25 made of $SiO_2$ or $Si_3N_4$ is deposited on the interlayer insulating film 5 to cover the ferroelectric capacitor 15 with the interlayer insulating film 25. Thereafter, the interlayer insulating films 5 and 25 are subjected to the photolithography and etching, and thereby openings that expose the source region 8a and the drain region 9a, electrodes 16 and 18, the source region 8b and the drain region 9b are formed. In the next place, on the interlayer insulating film 25, a conductive film is deposited and the openings each are buried with the conductive film. Subsequently, the conductive film is patterned by means of the photolithography and etching and thereby a source electrode 12 and a drain electrode 13, a plate line PL, a plate line connection portion 20 and a bit line BL are formed.

Here, the SOI substrate is used. However, as far as a substrate has a structure in which a semiconductor film is formed on an insulating film, other kinds of substrates may be used. For instance, an SOS (Silicon On Sapphire) substrate in which a semiconductor film is formed on a sapphire substrate and a substrate for use in TFT fabrication in which a semiconductor film is formed on a glass substrate may be used.

(Operations)

In the present embodiment, although the active region 4b of the plate line driving portion 22 is formed in the supporting substrate 1, the active region 4a of the selection transistor 6a is insulated by the insulating film 2 from the supporting substrate 1; accordingly, similarly to the first embodiment, between the electrodes 16 and 18 of the ferroelectric capacitor 15, a path in which charges transfer through the supporting substrate 1 is not formed. Furthermore, similarly to the first embodiment, the power supplies 33 and 34 are formed into separate systems and completely insulated at the time of non-operation and the ground lines GND1 and GND2 are insulated from each other; accordingly, between the electrodes 16 and 18 of the ferroelectric capacitor 15, neither a path in which charges transfer through the power supplies 33 and 34 nor a path in which charges transfer through the ground lines GND1 and GND2 is formed. Accordingly, at the time of high temperature data retention, that is, at the time of high temperature non-operation, even when the spontaneous polarization of the ferroelectric capacitor 15 decreases, charges of the electrodes 16 and 18 of the ferroelectric capacitor 15 do not transfer and are retained.

Furthermore, since active regions of the peripheral circuit region such as the transistors 6b and so on are formed on the supporting substrate 1, the instability that might be caused owing to the active region being floating at the time of operation of the transistors in the peripheral circuit region can be avoided.

(4) Fourth Embodiment (Configuration)

Figure 13A:
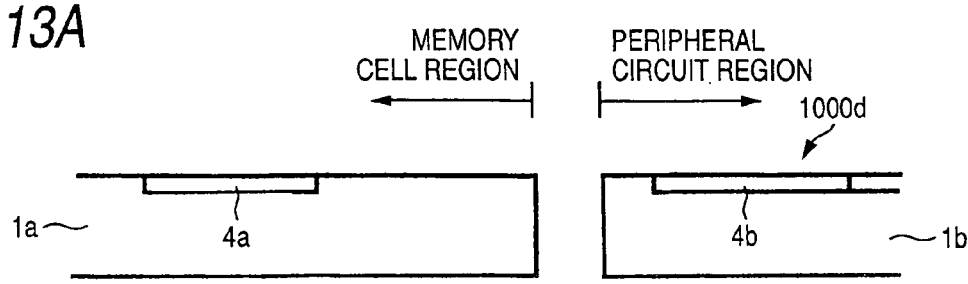
FIGS. 13A through 13C are sectional diagrams for explaining a method of fabricating a semiconductor memory device involving a fourth embodiment.
Figure 13B:
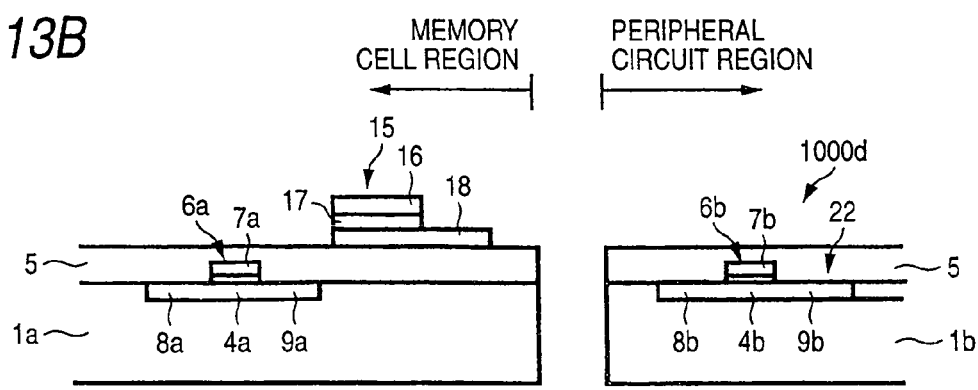
Figure 13C:
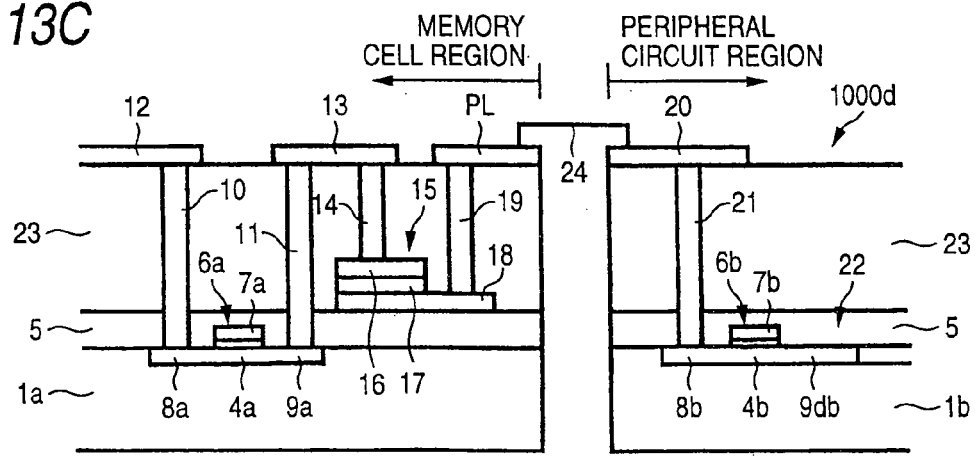

FIG. 13C is a sectional diagram of a semiconductor memory device 1000d involving a fourth embodiment. An electric circuit diagram of the semiconductor memory device 1000d is the same as FIG. 1.

In the present embodiment, a memory cell region and a peripheral circuit region, respectively, are formed on separate supporting substrates 1a and 1b, the supporting substrates 1a and 1b are disposed with a predetermined separation, and the memory cell region of the supporting substrate 1a and the peripheral circuit region of the supporting substrate 1b are connected with a wiring 24. The supporting substrates 1a and 1b are semiconductor substrates made of Si or the like. In addition, similarly to FIG. 1, a power supply for memory cell region 33 and a power supply for peripheral circuit region 34 are formed into separate systems and completely insulated at the time of non-operation.

(Fabrication Method)

Here, a case where the supporting substrates 1a and 1b are formed on the same semiconductor wafer will be explained. First, as shown in FIG. 13A, an N or P type impurity (for instance, phosphorus P as the N type impurity and boro n B as the P type impurity) is selectively ion implanted in the supporting substrates 1a and 1b followed by activating, and thereby active regions 4a and 4b are formed.

Subsequently, an insulating film made of $SiO_2$ and poly-silicon are sequentially deposited to mask regions where gate electrodes 7a and 7b and a word line WL are formed by means of photolithography and etching. The insulating film and the poly-silicon are etched by means of, for instance, RIE (Reactive Ion Etching) and thereby, as shown in FIG. 13B, a gate insulating film and gate electrodes 7a and 7b and a word line WL (not shown in the drawing) are formed.

Furthermore, in the active regions 4a and 4b a P or N type impurity (for instance, arsenic As as the N type impurity and boron B as the P type impurity) is implanted to form a source region 8a and a drain region 9a in the active region 4a and a source region 8b and a drain region 9b in the active region 4b.

Thereafter, by means of CVD method, an interlayer insulating film 5 made of $SiO_2$ or $Si_3N_4$ is deposited to cover the selection transistors 6a and the control transistor 6b with the interlayer insulating film 5. In the next place, on the interlayer insulating film 5, a Pt film, an STB film and a Pt film are sequentially deposited followed by patterning by means of photolithography and etching, and thereby a ferroelectric capacitor 15 is formed.

Subsequently, as shown in FIG. 13C, by means of CVD method, interlayer insulating films 25 made of $SiO_2$ or $Si_3N_4$, respectively, are deposited on the interlayer insulating films 5 to cover the ferroelectric capacitor 15 with the interlayer insulating film 25. Thereafter, the interlayer insulating films 5 and 25 are subjected to the photolithography and etching, and thereby openings that expose the source region 8a and the drain region 9a (selection transistor 6a), the electrodes 16 and 18, the source region 8b and the drain region 9b (control transistor 6b) are formed. In the next place, on the interlayer insulating film 25, a conductive film is deposited, and thereby the openings each are buried with the conductive film. Subsequently, the conductive film is patterned by means of the photolithography and etching and thereby a source electrode 12 and a drain electrode 13, a plate line PL, a plate line connection portion 20 and a bit line BL are formed.

A chip that includes the supporting substrate 1a and a chip that includes the supporting substrate 1b are separated from the semiconductor wafer, the chip that includes the supporting substrate 1a and the chip that includes the supporting substrate 1b are disposed with a predetermined separation, the plate line PL and the plate line connection portion 20 are connected with a wiring 24 and so on, and thereby the memory cell region and the peripheral circuit region are electrically connected.

Here, a case where the supporting substrates 1a and 1b are formed on the same semiconductor wafer is explained; however, the supporting substrates 1a and 1b may be formed on different semiconductor wafers. In this case, similarly to the above, on each of the supporting substrates 1a and 1b of the respective semiconductor wafers, a memory cell region and a peripheral circuit region are formed, the chip thereon the memory cell region is formed and the chip thereon the peripheral circuit region is formed are separated from the respective semiconductor wafers, the chip thereon the memory cell region is formed and the chip thereon the peripheral circuit region is formed are disposed with a predetermined separation, the plate line PL and the plate line connection portion 20 are connected with a wiring 24 and so on, and thereby the memory cell region and the peripheral circuit region are electrically connected.

(Operations)

In the present embodiment, although both the active region of the transistor in the memory cell region such as the selection transistor 6a and so on and the active region of the transistor in the peripheral circuit region such as the control transistor 6b and so on are formed on the supporting substrates 1a and 1b both of which are the substrate bulk region, the supporting substrate 1a and the supporting substrate 1b are disposed with a predetermined separation and completely insulated; accordingly, between the electrodes 16 and 18 of the ferroelectric capacitor 15, a path in which charges transfer through the supporting substrates 1a and 1b is not formed. Furthermore, similarly to the first embodiment, the power supplies 33 and 34 are formed into separate systems and completely insulated at the time of non-operation and the ground lines GND1 and GND2 are insulated from each other; accordingly, between the electrodes 16 and 18 of the ferroelectric capacitor 15, neither a path in which charges transfer through the power supplies 33 and 34 nor a path in which charges transfer through the ground lines GND1 and GND2 is formed. Accordingly, at the time of high temperature data retention, that is, at the time of high temperature non-operation, even when the spontaneous polarization of the ferroelectric capacitor 15 decreases, charges of the electrodes 16 and 18 of the ferroelectric capacitor 15 do not transfer and are retained.

Furthermore, in the present embodiment, since active region of the transistor in the memory cell region such as the selection transistor 6a and so on and the active region of the transistor in the peripheral circuit region such as the control transistor 6b and so on are formed on the supporting substrates 1a and 1b both of which are substrate bulk region, at the time of operation of the transistors in the memory cell region and peripheral circuit region, the instability that might be caused owing to the active region being floating can be avoided.

In the embodiments 1 through 3, the memory cell region and the peripheral circuit region may be formed on separate substrates. When forming on the separate substrates, the insulation on the substrate side between the electrodes 16 and 18 of the ferroelectric capacitor 15 can be more improved.

What is claimed is:

1. A method of fabricating a semiconductor memory device that has a selection transistor and a ferroelectric capacitor including:
    forming, on a substrate, first and second semiconductor regions insulated from each other through an insulating film;
    forming a selection transistor in the first semiconductor region and a control transistor of a plate line driving portion in the second semiconductor region;
    forming, on the selection transistor and the control transistor, through a first insulating film, a ferroelectric capacitor; and
    forming a bit line and a plate line through a second insulating film on the ferroelectric capacitor, electrically connecting the selection transistor to the bit line and the ferroelectric capacitor, and electrically connecting the ferroelectric capacitor and the plate line.

2. A method of fabricating a semiconductor memory device as set forth in claim 1:
    wherein the forming the first and second semiconductor regions includes partially removing a semiconductor film and an insulating film and exposing a supporting substrate in an SOI substrate where the semiconductor film is formed through the first insulating film on the supporting substrate;
    wherein the selection transistor is directly formed on the supporting substrate and the control transistor is formed on the semiconductor film.

3. A method of fabricating a semiconductor memory device as set forth in claim 1:
    wherein the forming the first and second semiconductor regions includes partially removing a semiconductor film and an insulating film and exposing a supporting substrate in an SOI substrate where the semiconductor film is formed through the first insulating film on the supporting substrate;
    wherein the selection transistor is formed in the semiconductor film, and the control transistor is directly formed on the supporting substrate.

4. A method of fabricating a semiconductor memory device that has a selection transistor and a ferroelectric capacitor including:
    preparing first and second semiconductor substrates;
    forming a selection transistor on the first semiconductor substrate and forming a ferroelectric capacitor through a first insulating film on the selection transistor;
    forming, on the ferroelectric capacitor, a bit line and a plate line through a second insulating film, electrically connecting the selection transistor to the bit line and the ferroelectric capacitor, and electrically connecting the ferroelectric capacitor to the plate line;
    forming, on the second semiconductor substrate, a control transistor of a plate line driving portion; and
    electrically connecting the control transistor and the plate line.

* * * * *